(12) United States Patent
Jeong et al.

(10) Patent No.: US 9,728,743 B2
(45) Date of Patent: Aug. 8, 2017

(54) ORGANIC LIGHT EMITTING DIODE DISPLAY WITH REINFORCED SEALING PORTION

(71) Applicant: SAMSUNG DISPLAY CO., LTD., Yongin-si, Gyeonggi-do (KR)

(72) Inventors: Chang Yong Jeong, Yongin-si (KR); Myung Suk Han, Yongin-si (KR)

(73) Assignee: SAMSUNG DISPLAY CO., LTD., Yongin, Gyunggi-Do (KR)

(*) Notice: Subject to any disclaimer, the term of this patent is extended or adjusted under 35 U.S.C. 154(b) by 0 days.

(21) Appl. No.: 15/098,442

(22) Filed: Apr. 14, 2016

(65) Prior Publication Data

US 2016/0233452 A1 Aug. 11, 2016

Related U.S. Application Data

(62) Division of application No. 14/074,919, filed on Nov. 8, 2013, now abandoned.

(30) Foreign Application Priority Data

Apr. 19, 2013 (KR) ........................ 10-2013-0043752

(51) Int. Cl.
*H01L 51/05* (2006.01)
*B82Y 10/00* (2011.01)
(Continued)

(52) U.S. Cl.
CPC .......... *H01L 51/5246* (2013.01); *H01L 51/52* (2013.01); *H01L 51/524* (2013.01); *H01L 51/5237* (2013.01)

(58) Field of Classification Search
CPC ............ H01L 51/0545; H01L 51/0036; H01L 51/0541; H01L 51/5012; H01L 51/56;
(Continued)

(56) References Cited

U.S. PATENT DOCUMENTS

| 6,791,660 B1 | 9/2004 | Hayashi et al. |
| 2004/0004434 A1* | 1/2004 | Nishi .................... H01L 27/322 313/506 |

(Continued)

FOREIGN PATENT DOCUMENTS

| KR | 10-2005-0040175 A | 5/2005 |
| KR | 10-2006-0112948 A | 11/2006 |

(Continued)

*Primary Examiner* — John C Ingham
*Assistant Examiner* — Didarul Mazumder
(74) *Attorney, Agent, or Firm* — Lee & Morse P.C.

(57) ABSTRACT

An organic light emitting diode display includes a display substrate including an organic light emitting element and a driving circuit part, an encapsulation substrate sealing the display substrate, and a sealing portion between the display substrate and the encapsulation substrate, the sealing portion including a plurality of sealing frame portions around the display substrate, and a first sealing frame portion of the plurality of sealing frame portions being adjacent to a pad portion, wherein at least one of a width of an edge of the sealing portion and a width of the first sealing frame portion is wider than a width of a sealing frame portion other than the first sealing frame portion.

12 Claims, 7 Drawing Sheets

(51) Int. Cl.
*H01L 51/00* (2006.01)
*H01L 51/50* (2006.01)
*H01L 27/12* (2006.01)
*H01L 51/56* (2006.01)
*B82Y 30/00* (2011.01)
*H01L 51/52* (2006.01)

(58) Field of Classification Search
CPC ..... H01L 27/1214; B82Y 10/00; B82Y 30/00; Y02E 10/50
USPC .................................. 257/40; 438/82, 88, 99
See application file for complete search history.

(56) References Cited

U.S. PATENT DOCUMENTS

| | | | |
|---|---|---|---|
| 2007/0228000 A1 | 10/2007 | Kim | |
| 2008/0074036 A1* | 3/2008 | Wang | H01L 51/5246 313/504 |
| 2009/0015136 A1* | 1/2009 | Lee | H01L 51/5246 313/503 |
| 2009/0218253 A1 | 9/2009 | Nguyen et al. | |
| 2009/0255213 A1 | 10/2009 | Schwartau | |
| 2010/0091233 A1* | 4/2010 | Yamagishi | G02F 1/1339 349/153 |
| 2010/0102719 A1 | 4/2010 | Lee et al. | |
| 2011/0163662 A1 | 7/2011 | Lim et al. | |

FOREIGN PATENT DOCUMENTS

| | | |
|---|---|---|
| KR | 10-2010-0052895 A | 5/2010 |
| TW | 200308179 A | 12/2003 |
| TW | 201316518 A | 4/2013 |

\* cited by examiner

ORGANIC LIGHT EMITTING DIODE DISPLAY WITH REINFORCED SEALING PORTION

CROSS-REFERENCE TO RELATED APPLICATIONS

This is a divisional application based on pending application Ser. No. 14/074,919, filed Nov. 8, 2013, the entire contents of which is hereby incorporated by reference.

The present application claims priority under 35 U.S.C. §119 to Korean Patent Application No. 10-2013-0043752, filed on Apr. 19, 2013, in the Korean Intellectual Property Office, and entitled: "Organic Light Emitting Diode Display," which is incorporated by reference herein in its entirety.

BACKGROUND

1. Field

The present disclosure relates to an organic light emitting diode display. More particularly, the present disclosure relates to an organic light emitting diode display which partially reinforces a width of a sealing material formed in an area except for a display area and a non-display area.

2. Description of the Related Art

A conventional organic light emitting diode display may include two electrodes and an organic emission layer positioned between the two electrodes. An electron injected from one electrode and a hole injected from the other electrode are coupled with each other in the organic emission layer to form an exciton, and the exciton emits energy to display light.

The conventional organic light emitting diode display may also include a display substrate with the organic emission layer, and an encapsulation substrate covering and sealing the display substrate. In addition, a sealant may be formed between the display substrate and the encapsulation substrate to seal and attach the display substrate and the encapsulation substrate.

SUMMARY

The present disclosure has been made in an effort to provide an organic light emitting diode display capable of preventing deformation of a cell seal structure.

An exemplary embodiment provides an organic light emitting diode display, including a display substrate including an organic light emitting element and a driving circuit part, an encapsulation substrate sealing the display substrate, and a sealing portion between the display substrate and the encapsulation substrate, the sealing portion including a plurality of sealing frame portions around the display substrate, and a first sealing frame portion of the plurality of sealing frame portions being adjacent to a pad portion, wherein at least one of a width of an edge of the sealing portion and a width of the first sealing frame portion is wider than a width of a sealing frame portion other than the first sealing frame portion.

The organic light emitting diode display may further include a sealing material at least at one inner edge of the sealing portion, the sealing material having a triangular shape.

The sealing material may be reinforced at two or more edges among inner edges of the sealing portion.

The sealing material may have a right-triangular shape, the sealing material fitting into an inner right-triangular shape of the inner edge of the sealing portion.

The sealing material may be only at edges of the sealing portion among all portions of the sealing portion, the sealing material being in direct contact with the inner edges of the sealing portion.

The width of the first sealing frame portion may be wider than the width sealing frame portions other than the first sealing frame portion by about 10% or more.

The organic light emitting diode display may further include a protruding portion on and protruding away from at least one of the sealing frame portions, a width of the protruding portion being wider than the sealing frame portions.

The protruding portion may have a semicircular shape.

The protruding portion may be at an opposite side.

The width of the edge of the sealing portion may be measured along a direction that is oblique with respect to a direction of the width of any adjacent sealing frame portion.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
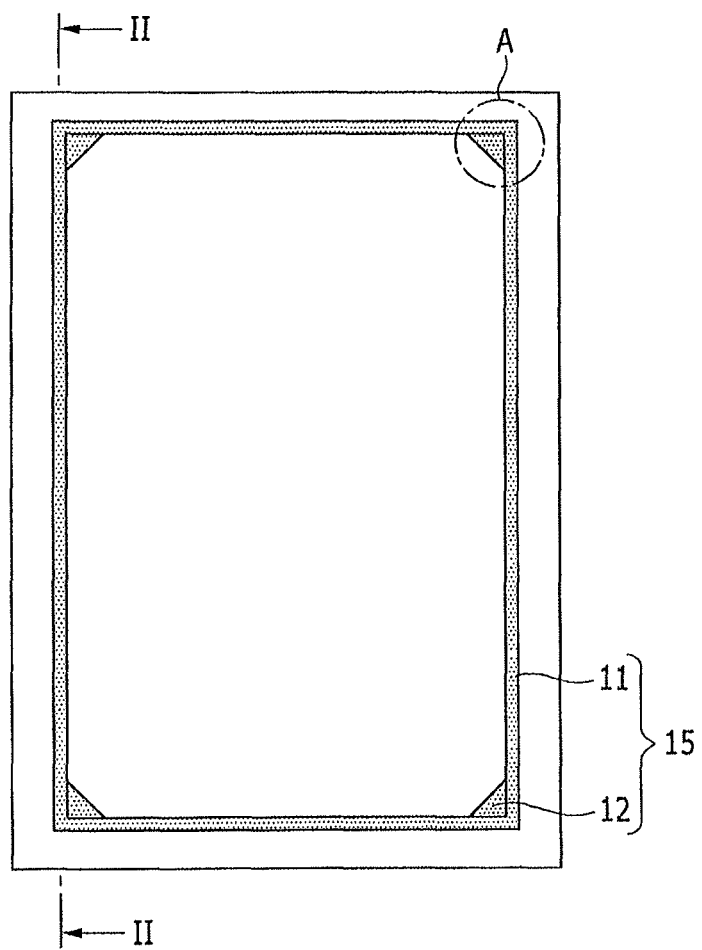
FIG. 1 illustrates a plan view of a unit cell of an organic light emitting diode display according to a first exemplary embodiment.

The present disclosure will be described more fully hereinafter with reference to the accompanying drawings, in which exemplary embodiments are shown. As those skilled in the art would realize, the described embodiments may be modified in various different ways, all without departing from the spirit or scope of the present disclosure. The drawings and description are to be regarded as illustrative in nature and not restrictive. Like reference numerals designate like elements throughout the specification.

Hereinafter, a configuration of an organic light emitting diode display according to an exemplary embodiment will be described in more detail with reference to the accompanying drawings.

Figure 2:
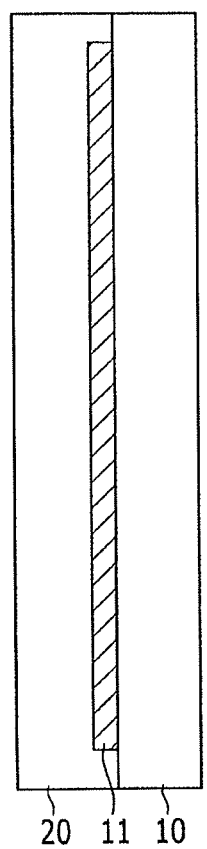
FIG. 2 illustrates a cross-sectional view taken along line II-II of FIG. 1.
Figure 3:
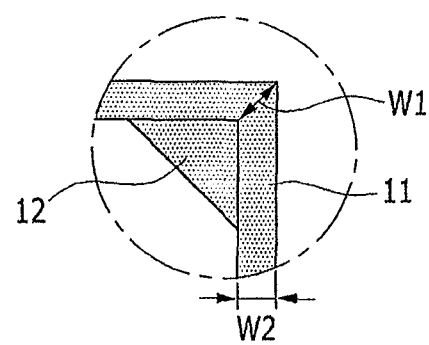
FIG. 3 illustrates a partially enlarged view of a portion A of FIG. 1.

FIG. 1 illustrates a plan view of a unit cell of an organic light emitting diode display according to a first exemplary embodiment. FIG. 2 is a cross-sectional view along line II-II of FIG. 1. FIG. 3 is a partially enlarged view of portion A in FIG. 1.

An organic light emitting diode display according to an exemplary embodiment is designed such that a width of a sealing portion is larger in an area to which increased stress is applied. That is, a sealing portion in a pad area or at an edge may have a larger width than in other regions for structural reinforcement. As a result, it may be possible to prevent releasing or rupturing of a cell seal structure, i.e., of the sealing portion.

Referring to FIGS. 1 and 2, a unit cell of an organic light emitting diode display according to a first exemplary embodiment may include a display substrate 10 and an encapsulation substrate 20 facing each other, and a sealing portion 15. The sealing portion 15 may be formed between the display substrate 10 and the encapsulation substrate 20.

The display substrate 10 may include an organic light emitting element and a driving circuit part. In this case, the organic light emitting element may include an anode, an organic emission layer, and a cathode, and the driving circuit part may include at least two thin film transistors T1 and T2, and at least one storage capacitor CAP1.

The encapsulation substrate 20, as illustrated in FIG. 2, may be installed at an upper portion and at a side of the display substrate 10. The encapsulation substrate 20 serves to protect the organic light emitting elements and the driving circuit parts of the display substrate 10 from the outside by sealing the display substrate 10.

The sealing portion 15 may include a sealing frame 11 and a reinforced sealing material 12 reinforcing the sealing frame 11. The sealing frame 11 and the reinforced sealing material 12 will be separately described below.

The sealing frame 11 is formed to adhere along edges of the display substrate 10 and the encapsulation substrate 20, and to seal the display substrate 10 and the encapsulation substrate 20, as illustrated in FIG. 1. For example, the sealing frame 11 may extend continuously along an entire peripheral edge, e.g., en entire perimeter, of the display substrate 10 and/or the encapsulation substrate 20.

For example, the sealing frame 11 may have a quadrangular frame, so each edge of the sealing frame 11 may be configured at a right angle. In other words, as illustrated in FIGS. 1 and 3, two portions of the sealing frame 11 may be configured perpendicularly to each other to define a corner at a right angle, such that a surface contact between the two perpendicular portions is at an oblique angle to a side surface of each of the perpendicular portions that faces a center of the sealing frame 11. As a result, a width W1 (FIG. 3) of the corner, i.e., the surface contact, is larger than a width W2 of either of the two perpendicular portions of the sealing frame defining the corner. In other words, the width W1 can be defined as a diagonal of a square having a side that equals the width W2, so the width W1 equals W2*(√2), i.e., W1=W2*1.41421. As the width W1 is larger than the width W2, corners, i.e., edges, of the sealing frame 11 are reinforced to provide increased support against potential stress. In contrast, if an entire sealing frame has a uniform width, e.g., if edges of the frame are curved to have a same width as side portions of the frame, when a relatively large stress is concentrated at edges of the sealing frame, a cell rupturing phenomenon may occur.

In addition, as illustrated in FIGS. 1 and 3, the reinforced sealing material 12 may be closely installed at an edge of the sealing frame 11 to further increase the width W1. For example, the reinforced sealing material 12 may have a right triangular shape. For example, the reinforced sealing material 12 may fit into, e.g., and contact, an inner edge of sealing frame 11. For example, when the sealing frame 11 has a shape of a quadrangular frame, e.g., a rectangular frame, the right-triangular reinforced sealing material 12 may fit into the right-angled inner edge of sealing frame 11 to further increase a total width of the sealing material 12 at the edge of the sealing frame 11. As the reinforced sealing material 12 has a right-triangular shape that, e.g., directly, contacts portions of perpendicular sides of the sealing frame 11, e.g., portions of the sealing frame that define the edge, a relatively large stress amount concentrated at the edge may be dispersed. However, embodiments are not limited to the shape of the reinforced sealing material 12 described above.

The reinforced sealing material 12 may be installed at two or more edges among the four edges. The reinforced sealing material 12 may be integrally configured, e.g., formed, with the sealing frame 11 or may be separately configured, e.g., formed, from the sealing frame 11 to be fastened with, e.g., physically attached to, the sealing frame 11.

Hereinafter, various exemplary embodiments and modified embodiments of the sealing portion 15 for preventing releasing or rupturing of the cell seal structure will be described.

Figure 4:
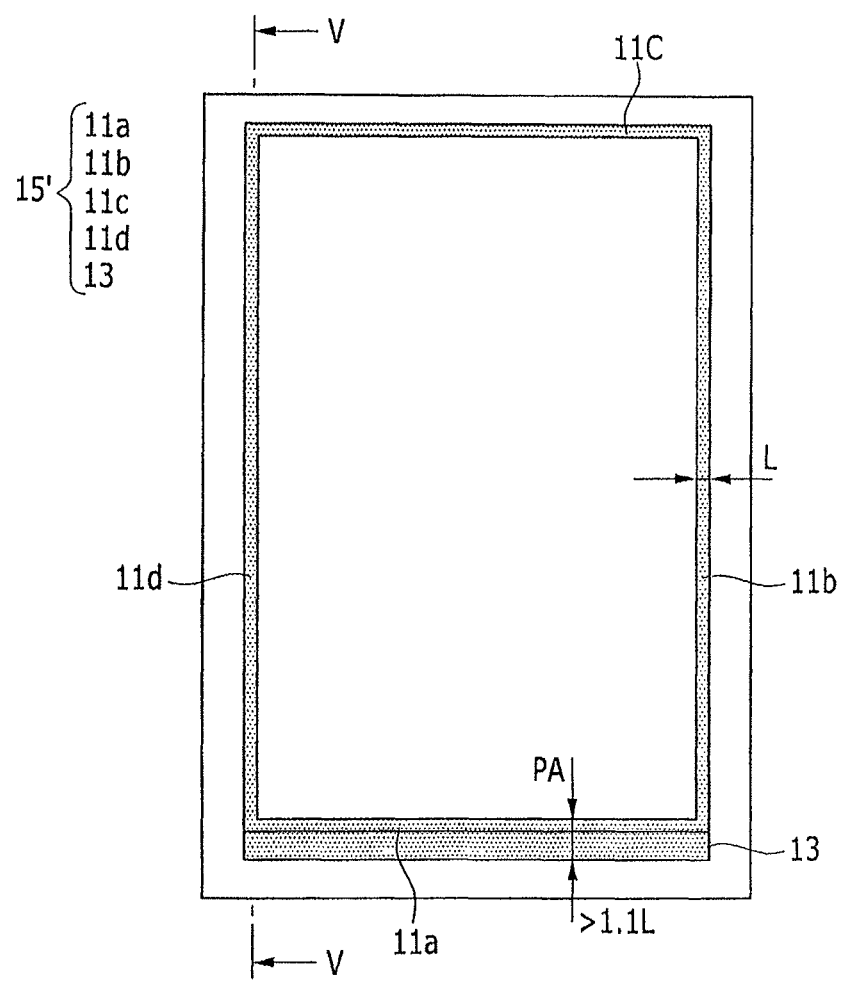
FIG. 4 illustrates a plan view of a unit cell of an organic light emitting diode display according to a second exemplary embodiment.
Figure 5:
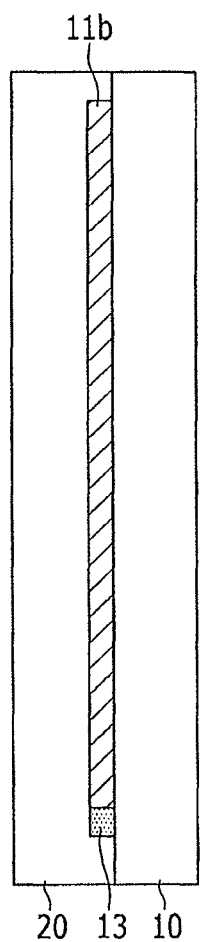
FIG. 5 illustrates a cross-sectional view taken along line V-V of FIG. 4.

FIG. 4 illustrates a plan view of a unit cell of an organic light emitting diode display according to a second exemplary embodiment. FIG. 5 is a cross-sectional view taken along line V-V of FIG. 4.

Referring to FIGS. 4 and 5, a unit cell of the organic light emitting diode display according to the second exemplary embodiment may include the display substrate 10, the encapsulation substrate 20, and a sealing portion 15'. In this case, since the display substrate 10 and the encapsulation substrate 20 are the same as the configuration of the first exemplary embodiment described above, the same reference numerals are used and a duplicate description is omitted.

The sealing portion 15', which is different from the configuration of the first exemplary embodiment, will be mainly described. The sealing portion 15' of the second exemplary embodiment may include the sealing frame 11 and a reinforced sealing material 13 reinforcing the sealing frame 11.

In detail, the sealing frame 11 is the same as in the first exemplary embodiment. In FIG. 4, sealing frame portions positioned in a counter clockwise (CCW) direction from a sealing frame portion positioned at a lower side are illustrated as first to fourth sealing frames 11a, 11b, 11c, and 11d, respectively.

Meanwhile, the reinforced sealing material 13 is formed at the lower side of the first sealing frame portion 11a, among the first to fourth sealing frame portions 11a, 11b, 11c, and 11d, as illustrated in FIGS. 4 and 5.

In more detail, GATE/SD wires are concentrated in a pad area, e.g., in a region of the organic light emitting diode display overlapping the first sealing frame portion 11a, so a step is non-uniformly formed in the pad area. As a result, the cell seal structure may be relatively unstable in the pad area, and releasing or rupturing may easily occur.

However, according to embodiments, the reinforced sealing material 13 is added in the pad area positioned at the lower side. For example, as illustrated in FIGS. 4-5, the reinforced sealing material 13 may contact, e.g., directly contact, and extend along, e.g., an entire length of, the first sealing frame portion 11a. As a result, a combined width PA of the first sealing frame portion 11 with the reinforced sealing material 13 is larger than a width L of each of the second through fourth sealing frame portions 11b, 11c, and 11d. For example, the combined width PA of the first sealing frame portion 11a with the reinforced sealing material 13 may be larger than the width L of each of the second through fourth sealing frame portions 11b, 11c, and 11d by about 10% or more.

It is noted that in FIGS. 4 and 5 the size of the sealing material 13 is not to scale. That is, in order to emphasize the reinforced sealing material 13, the width of the reinforced sealing material 13 is exaggerated.

Figure 6:
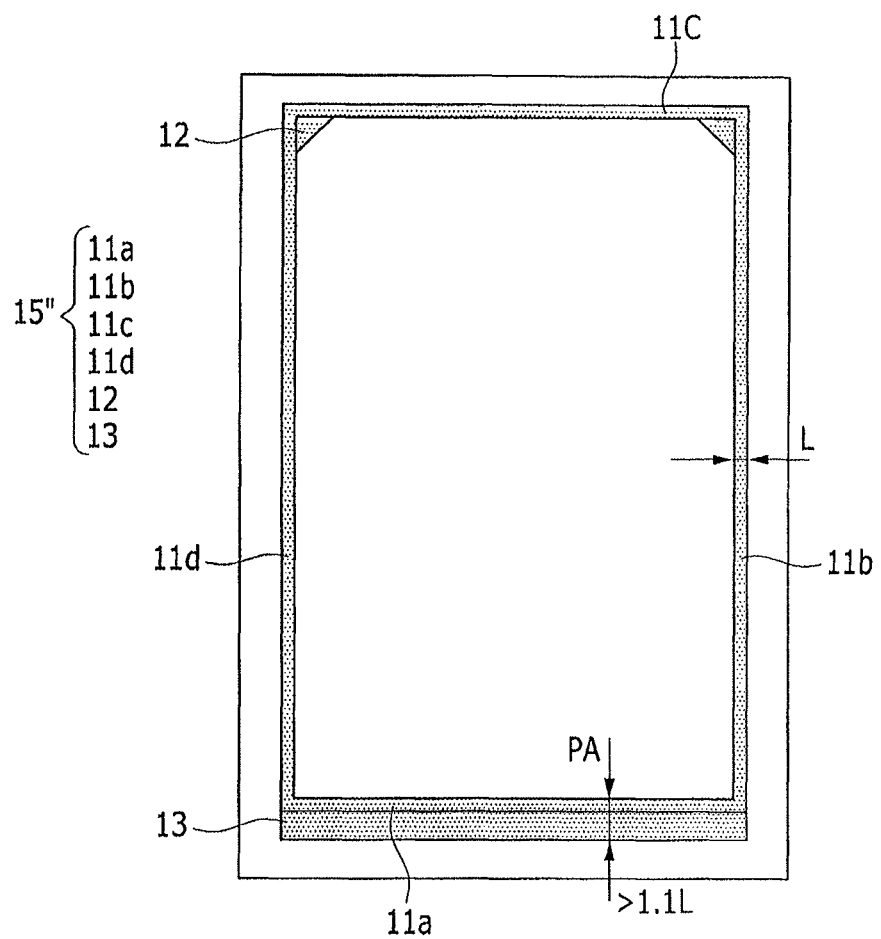
FIG. 6 illustrates a plan view of a unit cell of an organic light emitting diode display according to a third exemplary embodiment.

FIG. 6 is a plan view of a unit cell of an organic light emitting diode display according to a third exemplary embodiment.

Referring to FIG. 6, a unit cell of an organic light emitting diode display according to the third exemplary embodiment may include the display substrate, the encapsulation substrate, and a sealing portion 15″. The sealing portion 15″ may include the sealing frame 11 and the reinforced sealing materials 12 and 13 reinforcing the sealing frame 11. The sealing frame 11 may include first to fourth sealing frame portions 11a, 11b, 11c, and 11d.

In this case, since the display substrate, the encapsulation substrate, and the sealing frame 11 are the same as those described previously with respect to FIGS. 1-5 above, duplicate description thereof is omitted.

The reinforced sealing materials 12 and 13 in FIG. 6 include the reinforced sealing material 12 of the first exemplary embodiment and the reinforced sealing material 13 of the second exemplary embodiment. For example, as illustrated in FIG. 6, at an upper side of the sealing frame 11, the reinforced sealing material 12 according to the first exemplary embodiment may be closely installed at each upper edge to disperse stress concentrated at the edges. For example, as further illustrated in FIG. 6, at a lower side of the sealing frame 11, the reinforced sealing material 13 may be formed in the pad area according to the second exemplary embodiment.

In the exemplary embodiment, the reinforced sealing material 12 has a right triangular shape and is installed only at the upper side, but embodiments are not limited thereto. In addition, the reinforced sealing material 12 may be integrally configured with the sealing frame 11 or may be separately configured from the sealing frame 11 to be fastened with the sealing frame 11.

In the exemplary embodiment, a width of the first sealing frame portion 11a, to which the reinforced sealing material 13 is added, is larger than corresponding widths of the other second to fourth sealing frame portions 11b, 11c, and 11d. As a result, it may be possible to prevent cell releasing or rupturing. As described above, the combined width of the first sealing frame portion 11a with the reinforced sealing material 13 may be larger than the widths of the second to fourth sealing frame portions 11b, 11c, and 11d by about 10% or more.

Figure 7:
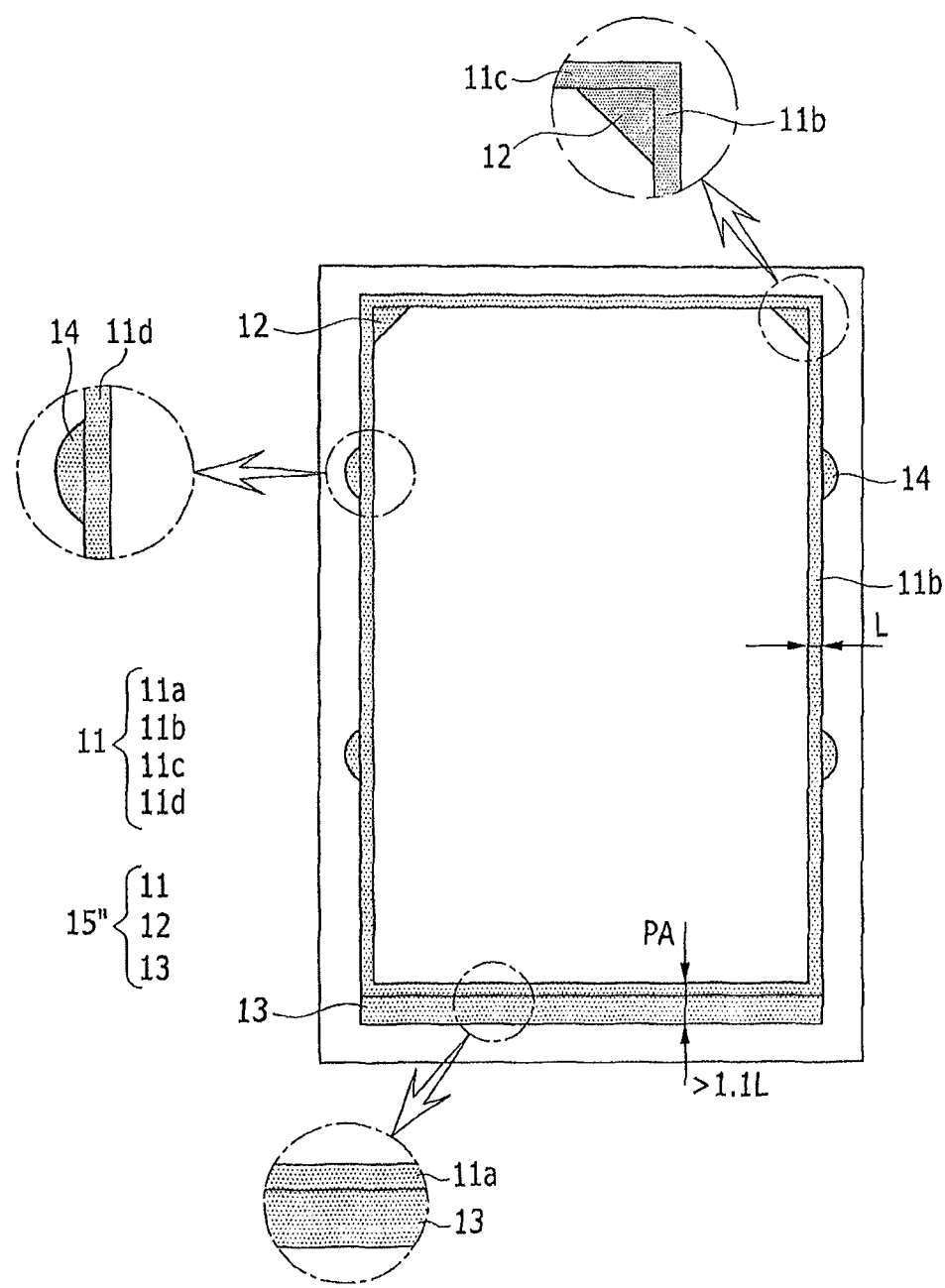
FIG. 7 illustrates a plan view of a unit cell of an organic light emitting diode display according to a fourth exemplary embodiment.

FIG. 7 is a plan view of a unit cell of an organic light emitting diode display according to a fourth exemplary embodiment.

Referring to FIG. 7, a unit cell of an organic light emitting diode display according to the fourth exemplary embodiment may include the display substrate, the encapsulation substrate, the sealing portion 15″, and a protruding portion 14. Further, the sealing portion 15″ may include the sealing frame 11 and reinforced sealing materials 12 and 13 reinforcing the sealing frame 11, and the sealing frame 11 may include first to fourth sealing frame portions 11a, 11b, 11c, and 11d.

In this case, since the display substrate, the encapsulation substrate, the sealing frame 11, and the reinforced sealing materials 12 and 13 are the same as the configurations of the first to third exemplary embodiments described above, a duplicate description is omitted.

The protruding portion 14, as illustrated in FIG. 7, may be installed on at least one sealing frame portion among sealing frame portions of the sealing frame 11 where the reinforced sealing material 13 is not formed, e.g., on the second to fourth sealing frame portions 11b through 11d. The protruding portion 14 may protrude from the sealing frame 11 in an outer direction and may have a larger width than a width of the sealing frame 11. As a result, since the reinforced sealing materials 12 and 13 and the protruding portion 14 selectively, e.g., locally, increase a width of the sealing frame 11, a place where stress is concentrated may be reinforced.

In FIG. 7, the protruding portion 14 is formed only at the second and fourth sealing frame portions 11b and 11d, but is not limited thereto. Further, in FIG. 7, the protruding portion 14 is illustrated as a semicircular shape, but so long as the width of the protruding portion 14 extends in the outer direction, e.g., convex, the shape of the protruding portion is not limited thereto. Further, exemplary embodiments may include the display substrate, the encapsulation substrate, and the protruding portion 14, without configuring the sealing portion 15″.

According to the exemplary embodiment, a width of a sealing portion may be non-uniform, i.e., may be designed to be larger in a partial area to which a lot of stress is applied. As a result, it may be possible to prevent releasing or rupturing of the sealing portion.

In contrast, a conventional organic light emitting diode display may include a sealing portion with a uniform width along an entire circumference of the display substrate, while four edges of the sealing portion may be curved to have a radius of R and a width of L, i.e., four sides and the widths L are the same as each other. However, as stress may be concentrated in a pad area, i.e., where a step is non-uniform, or at an edge, i.e., including a curved portion R of the edge, the conventional sealing portion may rupture. Further, when implementing a large size, the problem is further increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
   a display substrate including an organic light emitting element and a driving circuit part;
   an encapsulation substrate sealing the display substrate; and
   a sealing portion between the display substrate and the encapsulation substrate, the sealing portion including a plurality of sealing frame portions around the display substrate, and a first sealing frame portion of the plurality of sealing frame portions being adjacent to a pad portion; and
   a protruding portion on and protruding away from at least one of the sealing frame portions, a width of the protruding portion being wider than the sealing frame portions,
   wherein at least one of a width of an edge of the sealing portion and a width of the first sealing frame portion is wider than a width of a sealing frame portion other than the first sealing frame portion, and wherein the plurality of sealing frame portions are linear members contacting each other to define a frame-shaped sealing portion around the display substrate, the protruding portion protruding away from an interior of the defined frame-shape;

wherein the protruding portion is separated and spaced apart from each corner of the frame-shaped sealing portion.

2. The organic light emitting diode display as claimed in claim 1, wherein the protruding portion has a semicircular shape.

3. The organic light emitting diode display as claimed in claim 2, wherein the semicircular shape of the protruding portion protrudes away from the frame-shaped sealing portion.

4. The organic light emitting diode display as claimed in claim 1, wherein at least two sealing frame portions other than the first sealing frame portion contacting each other are perpendicular to each other, a surface contact between the two perpendicular sealing frame portions is at an oblique angle to a side surface of each of the perpendicular sealing frame portions, and a width of the surface contact being larger than a width of either of the two perpendicular sealing frame portions.

5. The organic light emitting diode display as claimed in claim 1, wherein a plurality of the protruding portions is positioned on the sealing frame portions, the plurality of protruding portions contact at least two different sealing frame portions.

6. The organic light emitting diode display as claimed in claim 5, wherein the plurality of the protruding portions are arranged symmetrically on the at least two different sealing frame portions.

7. The organic light emitting diode display as claimed in claim 1, wherein the protruding portion has a convex shape.

8. The organic light emitting diode display as claimed in claim 2, wherein the width of the protruding portion equals a radius of the semicircular shape.

9. The organic light emitting diode display as claimed in claim 1, wherein the protruding portion is attached to and extends from an external surface of the at least one of the sealing frame portions.

10. The organic light emitting diode display as claimed in claim 1, wherein the frame-shaped sealing portion has a closed shape, and the protruding portion is completely external with respect to the frame-shaped sealing portion.

11. The organic light emitting diode display as claimed in claim 6, wherein each of the plurality of the protruding portions is separated and spaced apart from each corner of the frame-shaped sealing portion.

12. The organic light emitting diode display as claimed in claim 11, wherein protruding portions on a same sealing frame portion are arranged equidistantly from each other and from respective corners of the frame-shaped sealing portion.

* * * * *